United States Patent [19]
Kiefer et al.

[11] Patent Number: 5,545,990
[45] Date of Patent: Aug. 13, 1996

[54] AVERAGING OF IDENTICALLY PHASE-ENCODED MR SIGNALS TO REDUCE IMAGE DEGRADATION CAUSED BY SPIN-SPIN RELAXATION

[75] Inventors: Berthold Kiefer, Erlangen, Germany; David A. Feinberg, New York, N.Y.

[73] Assignee: Siemens Aktiengesellschaft, Berlin & Munich, Germany

[21] Appl. No.: 218,163

[22] Filed: Mar. 25, 1994

[51] Int. Cl.⁶ .................................................. G01V 3/00
[52] U.S. Cl. .................................... 324/307; 324/309
[58] Field of Search ............................... 324/300, 312, 324/313, 314, 307, 309

[56] References Cited

U.S. PATENT DOCUMENTS 5,119,026  6/1992  Iino et al. ........................... 324/309
5,270,654  12/1993  Feinberg et al. .................... 324/309

*Primary Examiner*—Louis M. Arana
*Attorney, Agent, or Firm*—Mark H. Jay

[57] ABSTRACT

Echo signals from the same multiple echo pulse train sequence which are taken at the same phase-encoding gradient are averaged to prevent spin-spin relaxation from degrading an MR medical diagnostic image. Echo signals from two different pulse sequences taken at the same phase-encoding gradient and occupying different temporal positions within each pulse sequence are likewise averaged.

10 Claims, 7 Drawing Sheets

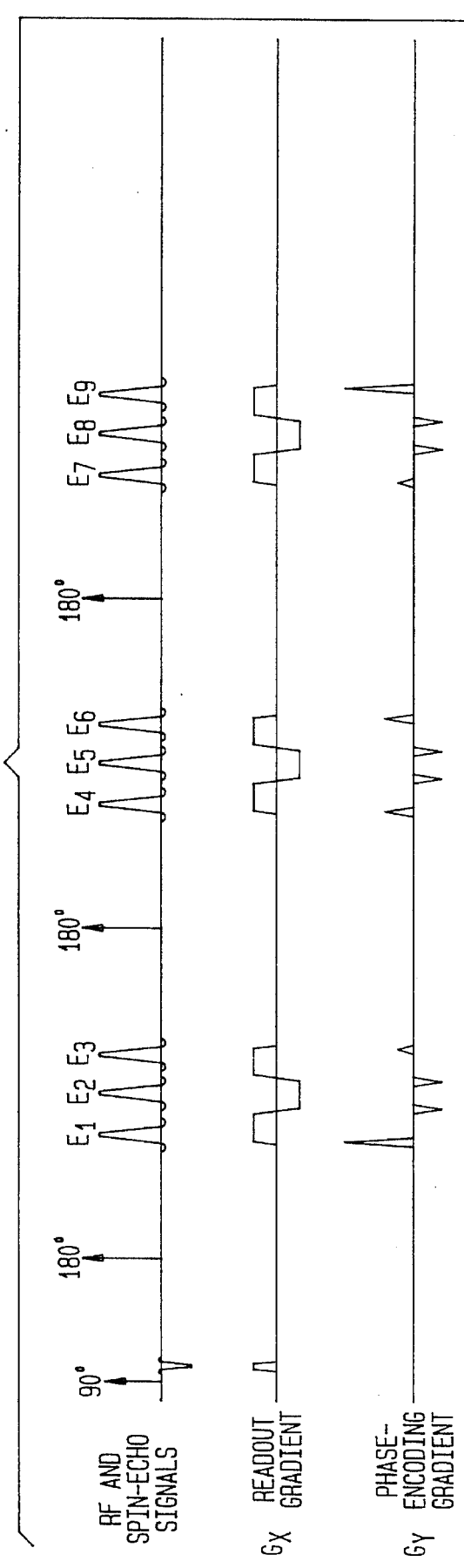
FIG. 4
FIG. 5

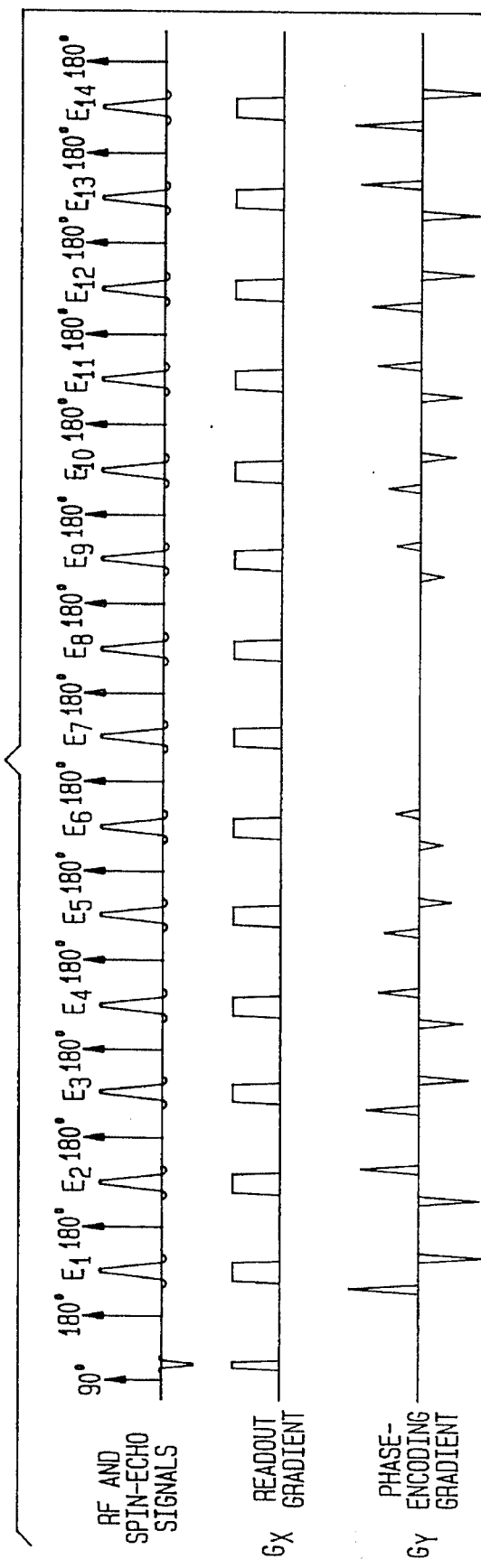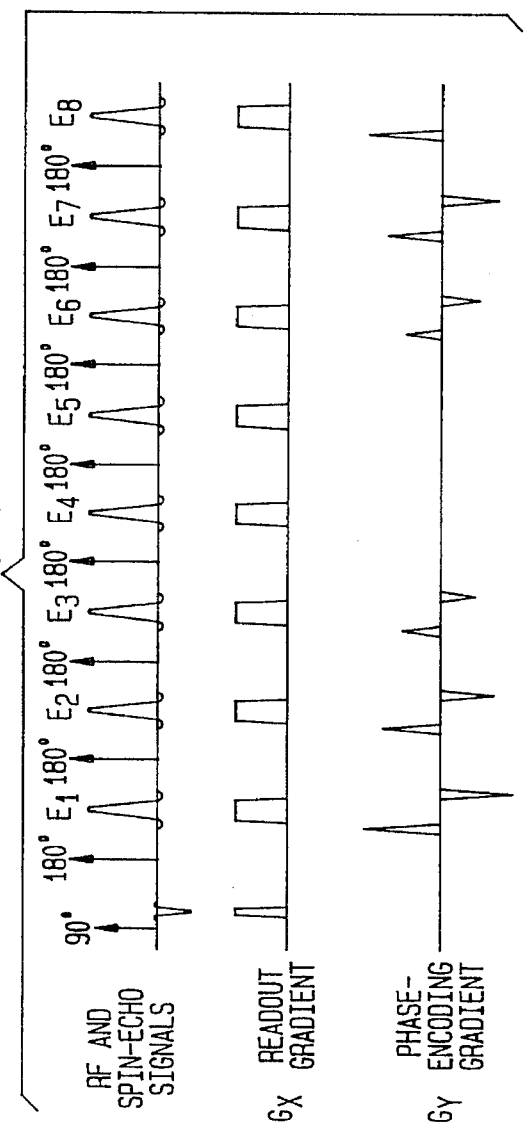

FIG. 10

| | |
|---|---|
| AVERAGE E1 & E14 | SEGMENT 1 |
| AVERAGE E3 & E12 | SEGMENT 2 |
| AVERAGE E5 & E10 | SEGMENT 3 |
| AVERAGE E7 & E8 | SEGMENT 4 |
| AVERAGE E6 & E9 | SEGMENT 5 |
| AVERAGE E4 & E11 | SEGMENT 6 |
| AVERAGE E2 & E13 | SEGMENT 7 |

ROW +128 (top), ROW 0 (middle), ROW −127 (bottom)

FIG. 11

| | |
|---|---|
| AVERAGE E1 & E8 | SEGMENT 1 |
| AVERAGE E2 & E7 | SEGMENT 2 |
| AVERAGE E3 & E6 | SEGMENT 3 |
| AVERAGE E4 & E5 | SEGMENT 4 |
| | SEGMENT 5 |
| | SEGMENT 6 |
| | SEGMENT 7 |

ROW +128 (top), ROW −128 (bottom)

FIG. 12

| | |
|---|---|
| AVERAGE E1,1 & E13,2 | SEGMENT 1 |
| AVERAGE E4,1 & E10,2 | SEGMENT 2 |
| AVERAGE E7,1 & E7,2 | SEGMENT 3 |
| AVERAGE E10,1 & E4,2 | SEGMENT 4 |
| AVERAGE E13,1 & E1,2 | SEGMENT 5 |
| AVERAGE E2,1 & E14,2 | SEGMENT 6 |
| AVERAGE E5,1 & E11,2 | SEGMENT 7 |
| AVERAGE E8,1 & E8,2 | SEGMENT 8 |
| AVERAGE E11,1 & E5,2 | SEGMENT 9 |
| AVERAGE E14,1 & E2,2 | SEGMENT 10 |
| AVERAGE E3,1 & E15,2 | SEGMENT 11 |
| AVERAGE E6,1 & E12,2 | SEGMENT 12 |
| AVERAGE E9,1 & E9,2 | SEGMENT 13 |
| AVERAGE E12,1 & E6,2 | SEGMENT 14 |
| AVERAGE E15,1 & E3,2 | SEGMENT 15 |

ROW +128 (top), ROW −128 (bottom)

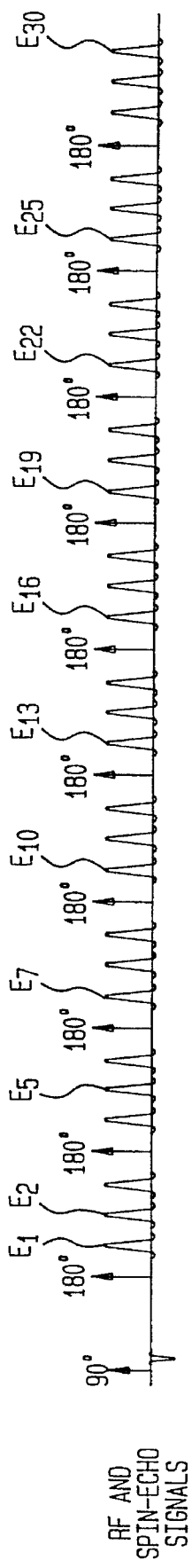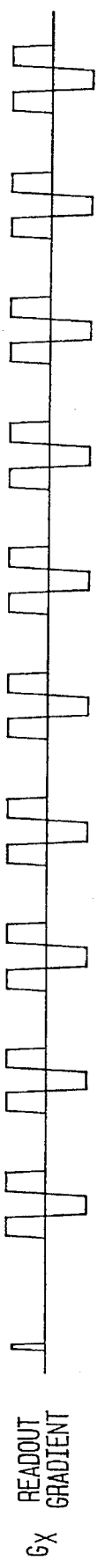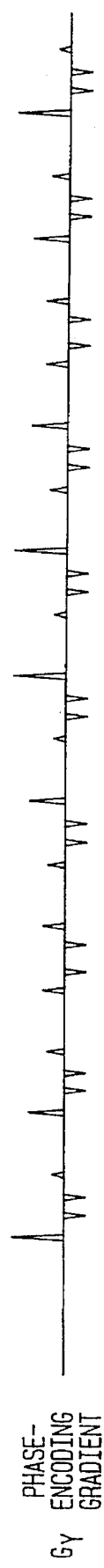
FIG. 13

AVERAGING OF IDENTICALLY PHASE-ENCODED MR SIGNALS TO REDUCE IMAGE DEGRADATION CAUSED BY SPIN-SPIN RELAXATION

BACKGROUND OF THE INVENTION

The invention relates to magnetic resonance (MR) imaging, and more particularly relates to MR imaging for diagnostic medical applications. In its most immediate sense, the invention relates to medical diagnostic MR imaging in which long spin-echo or long gradient spin-echo pulse sequences are used to form an MR image.

To understand the background of the invention, two long pulse sequences will first be described. The effect of spin-spin relaxation (also known as $T_2$ relaxation) on the MR images produced by these pulse sequences will also be explained.

A spin echo pulse sequence which is available for use on MR machines manufactured by Siemens AG and which is known as "TurboSE" is schematically illustrated in FIG. 1. This sequence is a so-called "spin echo" sequence because each scan commences with a 90° RF pulse followed by a series of 180° RF pulses (which are known as "refocussing pulses"). After each of these refocussing pulses, a signal is read out. As the pulse sequence continues, the phase-encoding gradient is progressively decreased. Thus, after the first refocussing pulse, the phase-encoding gradient starts out at the most positive value (before spin echo $E_1$). After the next refocussing pulses, the phase-encoding gradient decreases to 0 (before spin echo $E_4$ which follows the fourth refocussing pulse). At the end of the pulse sequence, the phase-encoding gradient reaches the most negative value (before spin echo $E_7$, which follows the seventh refocussing pulse).

FIG. 3 schematically illustrates how the spin echo signals produced by this turboSE pulse sequence are assigned to a 256-row data matrix (known as a matrix in "k-space") which is later subjected to Fourier transformation. The raw data matrix is divided into a plurality of segments; the segments are equal in number to the number of signals obtained within a single scan. (In the present instance, there are seven segments, but this is only for purposes of illustration.) During each scan, one row of each segment is acquired. The sequence is repeated until all rows of all segments have been acquired, i.e. until a-complete set of data has been collected. As can be seen in FIG. 3, spin echo $E_1$ with the highest positive phase-encoding gradient is assigned to one row of the first segment, spin echo $E_4$ with a zero phase-encoding gradient is assigned to a row in a central segment (the most significant part for the Fourier transformation with respect to signal-to-noise ratio) and spin echo $E_7$ is assigned to a row in the last segment with the highest negative phase-encoding gradient.

FIG. 1 and FIG. 3 also correlate the magnitude of the induced spin echo signal (FIG. 2) with the pulse sequence which generates it (FIG. 1) and the resulting k-space matrix (FIG. 3). As is known to persons skilled in the art, spin-spin relaxation (otherwise known as $T_2$ relaxation) causes the induced MR spin echo signal to die out. Therefore, while a long spin echo pulse sequence as is illustrated in FIG. 1 produces a high amplitude signal at the beginning of the sequence (where the phase-encoding is positive), a signal of small amplitude is acquired at the end of the sequence (where the phase-encoding is negative). As a result, the resulting k-space matrix has a signal amplitude which progressively diminishes from segment to segment. When the k-space matrix information (time domain information) is transformed to image information (frequency domain information) during Fourier transformation, this is manifested as a blurring of the MR image, leading to a loss of resolution.

FIG. 4 schematically illustrates another pulse sequence of the type disclosed in U.S. Pat. No. 5,270,654. In this sequence, each refocussing pulse is read out three times in a row by initially using a positive readout gradient, subsequently using a negative readout gradient, and finally using a positive readout gradient. (There is some inconsistency in the terminology used to describe the resulting triplet of echo signals. It is clear that the middle echo in the triplet is a "spin echo" signal, but some persons have referred to the outer two echos of the triplet as "gradient echos". This is not precisely correct; these echos will hereinafter be simply referred to as "echos".) Furthermore, each one of the echo signals in the triplet is read out at a corresponding phase-encoding gradient; the gradient varies in each instance. Because this is a spin echo sequence wherein there are a plurality of read outs using different gradients after each refocussing pulse, this type of pulse sequence is known as a gradient spin echo sequence.

Thus, in this type of gradient spin echo sequence the first refocussing pulse is followed by three echo signals: $E_1$, $E_2$ and $E_3$. Echo signal $E_1$ is read out at a maximally positive phase-encoding gradient, echo signal $E_2$ is read out at a slightly positive phase-encoding gradient and echo signal $E_3$ is read out at a slightly negative phase-encoding gradient. The same pattern is repeated after each subsequent refocussing pulse, except with phase-encoding gradients of different magnitudes.

In this instance, the information produced by the nine echo signals $E_1$ through $E_9$ is reshuffled before it is input into the k-space matrix. This is because the k-space matrix information is organized by the magnitude of the phase-encoding gradient. FIG. 6 shows where the information from the nine echo signals generated by the gradient spin echo pulse sequence appears in the k-space matrix.

As in the previous instance, FIGS. 4, 5 and 6 also show the effect that $T_2$ relaxation has on the echo signals which are produced by this turboGSE pulse sequence. FIG. 6 clearly shows that the decay in the echo signals which is produced by $T_2$ relaxation, combined with the reshuffling of the echo signals when they are input to the k-space matrix, produces a periodicity in the k-space matrix; in each group of three adjacent rows in the k-space matrix, the first segment has the largest magnitude, the second segment has a lesser magnitude and the last segment has the least magnitude.

The time-domain information in the k-space matrix of FIG. 6 is converted into image information (frequency-domain information) using Fourier transformation. When this happens, the above-described periodicity in the contents of the k-space matrix is decoded as a so-called "ringing artifact", causing the final MR image to contain faint ghosts and inducing a loss of resolution.

It is therefore one object of the invention to provide a method of acquiring and processing MR data so that spin-spin relaxation does not degrade the reconstructed MR image, even in long pulse sequences.

Another object of the invention is to provide such a method which can be used without unduly prolonging an MR study in which the method is employed.

Still another object is, in general, to improve upon known MR pulse sequences.

In accordance with the invention, pairs of spin echo signals which have identical phase-encoding and which differ in amplitude as a result of spin-spin relaxation (i.e. which occupy different temporal positions in the same sequence or in different sequences) are averaged. The resulting averaged signals are then used in the place of the original spin echo signals. In preferred embodiments, the pairs of spin echo signals can be drawn from a single pulse sequence or from two identical and successive pulse sequences. The sequences may be of the full-Fourier or the half-Fourier type.

BRIEF DESCRIPTION OF THE DRAWINGS

The invention will be better understood with reference to the following illustrative and non-limiting drawings, in which:

FIG. 4 schematically shows a pulse sequence disclosed in U.S. Pat. No. 5,270,654;

FIG. 5 schematically shows how spin-spin relaxation affects the amplitude of the spin echo signals produced using the pulse sequence schematically shown in FIG. 4;

FIG. 7 schematically shows a pulse sequence in accordance with a first preferred embodiment of the invention;

FIG. 8 schematically shows a pulse sequence in accordance with a second preferred embodiment of the invention;

FIG. 10 shows a k-space matrix produced in accordance with the first preferred embodiment of the invention;

FIG. 11 shows a k-space matrix produced in accordance with the second preferred embodiment of the invention;

FIG. 12 shows a k-space matrix produced in accordance with the third preferred embodiment of the invention; and FIG. 13 shows another pulse sequence in accordance with the third preferred embodiment of the invention.

DETAILED DESCRIPTION OF PREFERRED EMBODIMENTS

Figure 1:
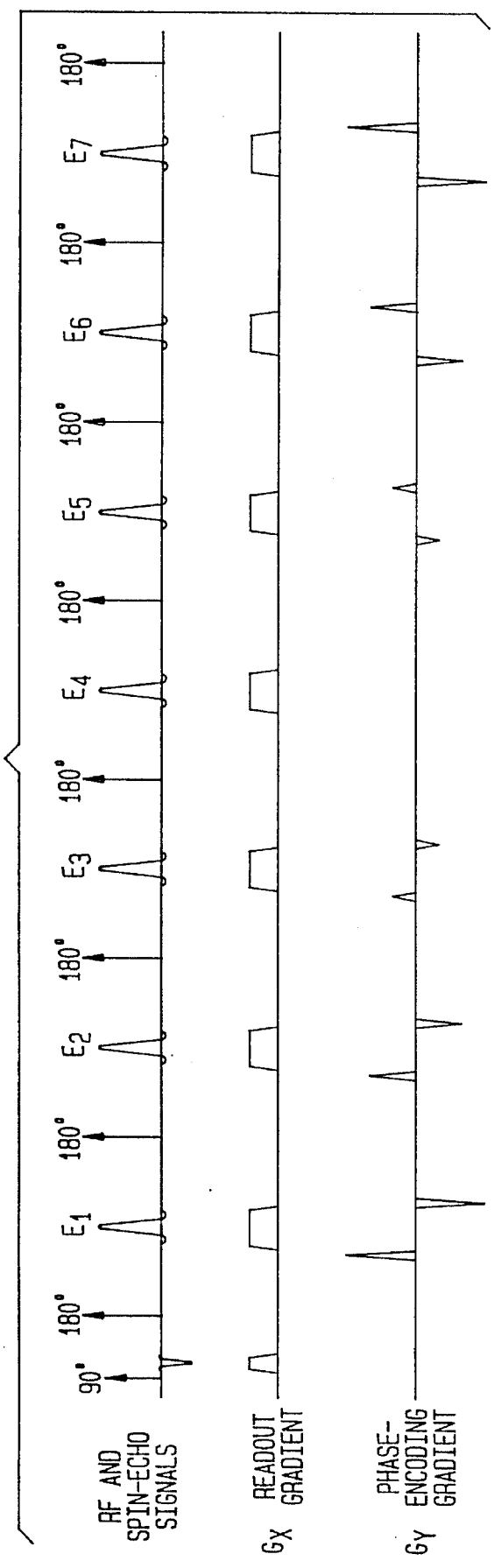
FIG. 1 schematically shows a spin echo pulse sequence which is now commercially available on MR machines manufactured by Siemens AG.
Figure 2:
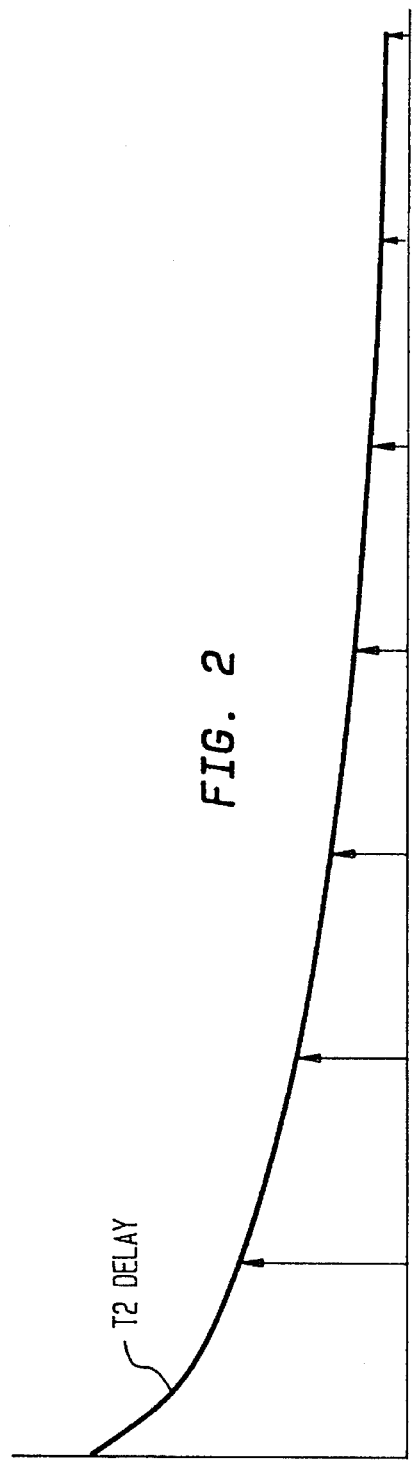
FIG. 2 schematically shows how spin-spin relaxation affects the amplitude of the spin echo signals produced using the pulse sequence schematically shown in FIG. 1.
Figure 3:
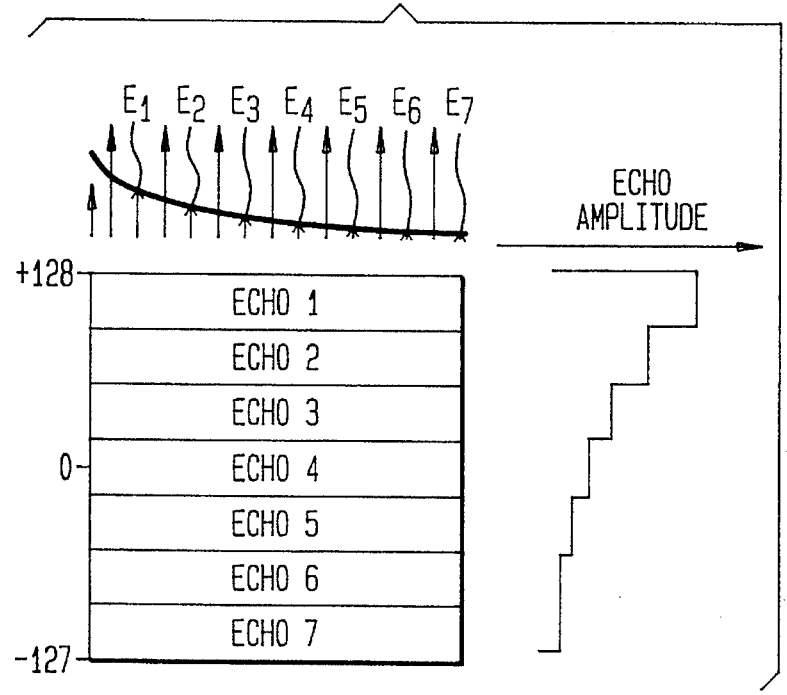
FIG. 3 schematically shows how the MR data produced using the pulse sequence schematically shown in FIG. 1 is utilized in a k-space matrix.
Figure 6:
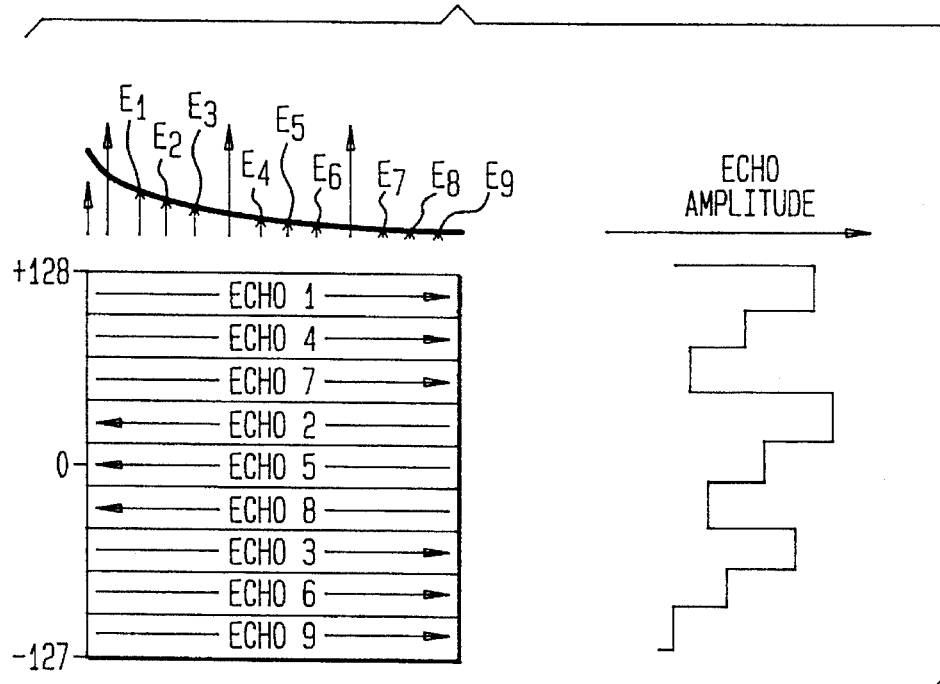
FIG. 6 schematically shows how the MR data produced using the pulse sequence schematically shown in FIG. 4 is utilized in a k-space matrix and how such k-space matrix has periodicity in such MR data.

A spin echo sequence in accordance with a first preferred embodiment of the invention will be discussed in connection with FIG. 7. This Figure shows a spin echo sequence with an even number (fourteen, in this example, but this is not part of the invention) of refocussing pulses. In this preferred embodiment, the phase-encoding gradient repeatedly alternates between positive and negative and also varies from initial extreme values through zero and back again. Thus, spin echo $E_1$ is read out after the first refocussing pulse after application of a positive maximum phase-encoding gradient, spin echo $E_2$ is read out after the second refocussing pulse after application of a negative maximum phase-encoding gradient, spin echo $E_3$ is read out after the third refocussing pulse after application of a positive phase-encoding gradient which is less than maximum, spin echo $E_4$ is read out after the fourth refocussing pulse after application of a negative phase-encoding gradient which is less than maximum, and so on. After two spin echo signals (in this instance, spin echo signals $E_7$ and $E_8$) have been read out with 0 phase-encoding, the phase-encoding gradient is progressively alternated and increased in magnitude but the sense of the alternation is reversed, so that spin echo signal $E_9$ is read out in the presence of a negative phase-encoding gradient, spin echo signal $E_{10}$ is read out in the presence of a positive phase-encoding gradient, and so on.

It is clear from FIG. 7 that the spin echo signal $E_1$ has the same phase-encoding as the spin echo signal $E_{14}$. Furthermore, the magnitude of the spin echo signal $E_1$ is at a maximum because it is induced at the very beginning of the pulse sequence, and the spin echo $E_{14}$ is at a minimum because it is induced at the very end of the pulse sequence, when $T_2$ relaxation has diminished the amplitude of the induced spin echo. In accordance with the invention, the spin echo signal $E_1$ is averaged with the spin echo signal $E_{14}$ and the average value of these two signals is used in the first segment of the k-space matrix (see FIG. 10). The same thing is done in the case of the spin echo signals $E_2$ and $E_{13}$, spin echo signals $E_3$ and $E_{12}$, spin echo signals $E_4$ and $E_{11}$, and so on. In this way, each line of information in the k-space matrix is created from the average of induced spin echo signals rather than from induced spin echo signals directly.

A pulse sequence in accordance with a second preferred embodiment of the invention is schematically illustrated in FIG. 8. This second preferred embodiment is also a spin echo sequence, but instead of filling up an entire k-space matrix (i.e. instead of acquiring a full set of data which runs from the most positive phase-encoding gradient through a 0 phase-encoding gradient to the most negative phase-encoding gradient) only a "half Fourier" set of data is acquired. In this second preferred embodiment, the phase-encoding gradient is initially at the maximum positive value and decreases to zero. Thereafter, the phase-encoding gradient increases to the maximum positive value at the end of the pulse sequence. This second preferred embodiment is used to reduce the length of an MR study. This second preferred embodiment also has the advantage that the phase-encoding gradient may be varied in a linear order and need not be switched back and forth between positive and negative polarities (which has certain adverse consequences for the electrical apparatus which drives the gradient coils). In the first preferred embodiment of the invention, wherein a full Fourier data set is acquired, the phase-encoding gradient alternates in polarity.

In a "half Fourier" acquisition in accordance with the second preferred embodiment, it is not necessary to limit data acquisition to e.g. the region between 0 phase-encoding and maximum positive phase-encoding. Rather, the phase-encoding gradient may vary from some positive maximum to some negative-minimum which has a different absolute value, i.e. the resulting k-space matrix may be asymmetric with respect to its center. By extending a "half Fourier" acquisition beyond the 0 phase-encoding gradient, the effect of phase errors is reduced.

Figure 9:
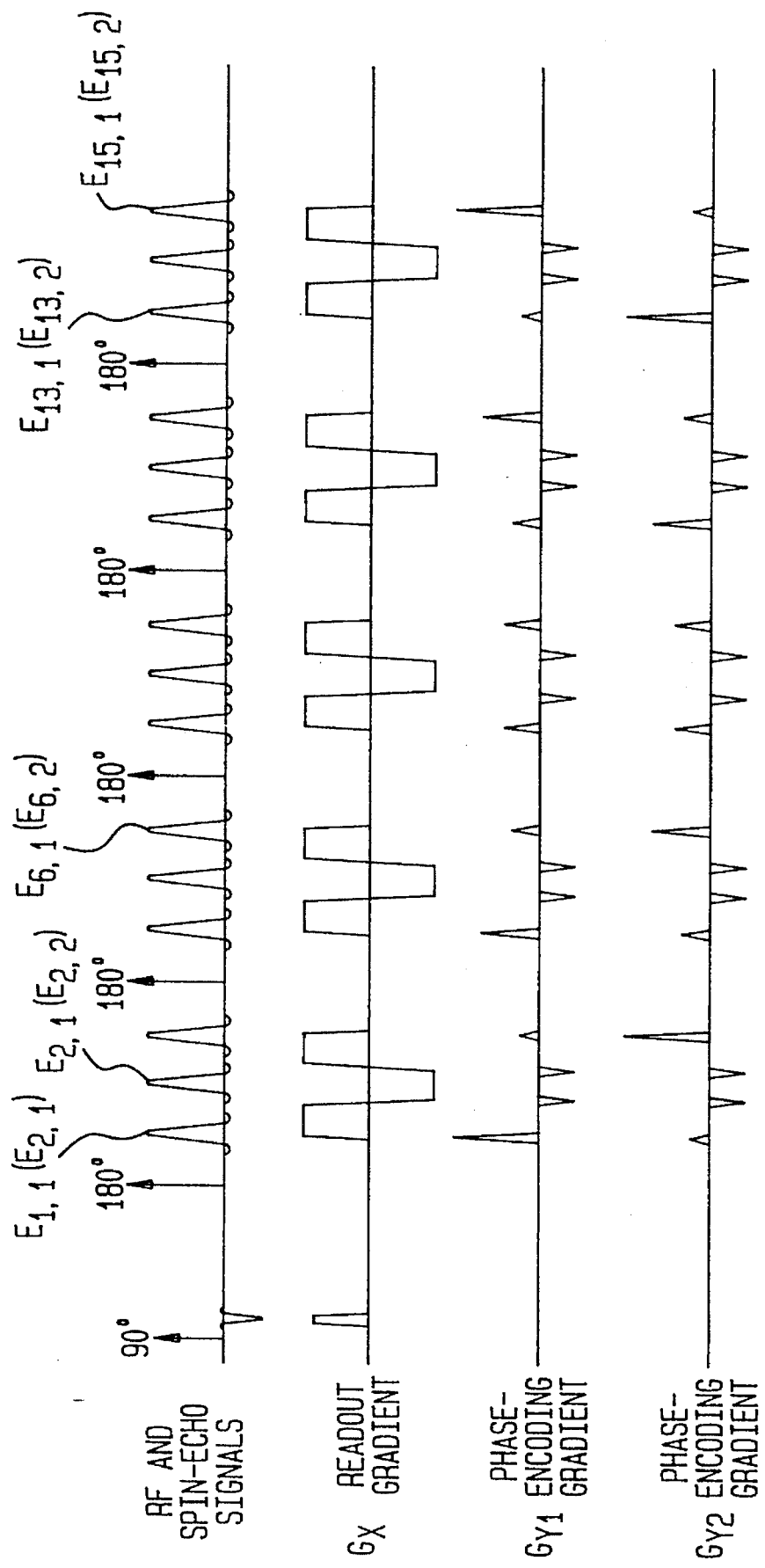
FIG. 9 schematically shows a pulse sequence in accordance with a third preferred embodiment of the invention.

A third preferred embodiment of the invention, which utilizes spin echo sequences, will be described in connection with FIG. 9. Here, averaging is carried out with respect to pairs of echo signals which are induced during two successive scans using two successive gradient spin echo pulse sequences.

These gradient spin echo pulse sequences are identical except for the phase-encoding gradients used. For this reason, FIG. 9 shows the sequences together, but the phase-encoding gradient used in the first sequence is shown along axis $G_{y1}$ and the phase-encoding gradient used in the second sequence is shown along axis $G_{y2}$. Advantageously but not necessarily, the polarity of the readout gradient in the second pulse sequence is an inversion of the polarity of the readout gradient used in the first pulse sequence. This reduces phase errors.

In the third preferred embodiment of the invention, the first gradient spin echo pulse sequence is commenced. Because as illustrated the sequence has five refocussing pulses (this is not a part of the invention, any number of refocussing pulses can be used) and after each refocussing pulse three signals are read out (likewise not a part of the invention), fifteen echo signals $E_{1,1}$, $E_{2,1}$, $E_{3,1}$, $E_{4,1}$, $E_{5,1}$, $E_{6,1}$, $E_{7,1}$, $E_{8,1}$, $E_{9,1}$, $E_{10,1}$, $E_{11,1}$, $E_{12,1}$, $E_{13,1}$, $E_{14,1}$ and $E_{15,1}$ are induced. Thereafter, the second gradient spin echo pulse sequence is commenced, and during this second pulse sequence fifteen echo signals $E_{1,2}$, $E_{2,2}$, $E_{3,2}$, $E_{4,2}$, $E_{5,2}$, $E_{6,2}$, $E_{7,2}$, $E_{8,2}$, $E_{9,2}$, $E_{10,2}$, $E_{11,2}$, $E_{12,2}$, $E_{13,2}$, $E_{14,2}$ and $E_{15,2}$ are likewise induced.

It will be observed that the echo signals $E_{1,1}$, $E_{2,1}$, and $E_{3,1}$ have the same phase encoding as do the echo signals $E_{13,2}$, $E_{14,2}$ and $E_{15,2}$. Furthermore, since the echo signals $E_{1,1}$, $E_{2,1}$, and $E_{3,1}$ are produced at the beginning of the first pulse sequence, the amplitude of these signals is high, and since the echo signals $E_{13,2}$, $E_{14,2}$ and $E_{15,2}$ are produced at the end of the second pulse sequence, the amplitude of these signals is low. In accordance with the third preferred embodiment of the invention, the echo signals $E_{1,1}$ and $E_{13,2}$ are averaged and the average is used to fill a row in the first segment of the k-space matrix (see FIG. 12). Likewise, the echo signals $E_{2,1}$ and $E_{14,2}$ are averaged and the average is used to fill a row in the fourth segment of the k-space matrix. This process is continued until all the echo signals induced during both pulse sequences have been averaged.

In another pulse sequence in accordance with the third preferred embodiment of the invention, only one spin echo pulse sequence is used. This sequence is schematically shown in FIG. 13. In the resulting k-space matrix, the first segment would be produced by averaging echos $E_1$ and $E_{28}$, the second segment would be produced by averaging echos $E_4$ and $E_{25}$, and so on. It will be noted that the pulse sequence illustrated in FIG. 13 uses a phase-encoding gradient which first varies as illustrated along axis $G_{y1}$ and which then varies as illustrated along axis $G_{y2}$ in FIG. 9. As a result, the pulse sequence schematically illustrated in FIG. 13 lasts twice as long as each of the two pulse sequences which are schematically illustrated in FIG. 9.

Because, in accordance with the invention, all signals within the k-space matrix are produced by averaging a high amplitude signal and a low amplitude signal, the amplitude variation within the k-space matrix is significantly reduced. This signal averaging also improves the signal-to-noise ratio by a factor of $\sqrt{2}$. However, this averaging doubles the time required to acquire a complete data set (i.e. to fill a k-space matrix with data). If it is less important to improve signal-to-noise ratio than it is to reduce acquisition time, the readout time for each echo can be reduced (e.g. by half). This produces an acquisition time and a signal-to-noise ratio which are comparable to those produced by a pulse sequence such as is disclosed by U.S. Pat. No. 5,270,654. However, each pulse sequence is shortened, signals within each pulse sequence are spaced more closely together, and signal amplitude variation is reduced.

Although a preferred embodiment has been described above, the scope of the invention is limited only by the following claims.

We claim:

1. A method of processing MR data acquired from a sample using a pulse sequence having a train of echos, comprising the following steps:

acquiring from the sample a first set of MR data signals at predetermined phase-encoding gradients;

acquiring from the sample a second set of MR data signals at predetermined phase-encoding gradients; and computing average MR data signals by averaging a first MR data signal from the first set of MR data signals and a second MR data signal from the second set of MR data signals, said first and second MR data signals having a like phase-encoding gradient and occupying different temporal positions within their corresponding sets of MR data signals.

2. A method of processing MR data acquired from a sample using a pulse sequence having a train of echos, comprising the following steps:

acquiring from the sample a set of MR data signals at predetermined phase-encoding gradients; and computing average MR data signals by averaging data signals having like phase-encoding gradients and occupying different temporal positions within said set of MR data signals.

3. A method of processing MR data signals which are acquired using a single pulse sequence which has an even number of refocussing pulses and which produces a plurality of pairs of identically phase-encoded echo signals, said method comprising the steps of selecting pairs of identically phase-encoded echo signals and averaging each such pair of identically phase-encoded echo signals.

4. A method of processing MR data signals which are acquired using two pulse sequences which each have a like number of refocussing pulses and which each produce an identical plurality of echo signals, said method comprising the steps of selecting pairs of identically phase-encoded echo signals which are drawn from different pulse sequences and which occupy different temporal positions in their respective pulse sequences, and averaging each such pair of identically phase-encoded echo signals.

5. A method of acquiring and processing MR data from a sample, comprising the following steps:

placing the sample in a homogeneous magnetic field;

applying to the sample a set of RF fields produced by a multiple-echo pulse sequence having an even number N of refocussing pulses and a plurality of gradient fields in such a manner as to cause the sample to produce N spin echo signals which are acquired at N/2 phase-encoding gradients, whereby N/2 pairs of spin echo signals are produced, each such pair containing spin echo signals acquired at an identical phase-encoding gradient;

averaging the spin echo signals in each such pair to produce N/2 average echo signals; and using said N/2 average echo signals as data for a Fourier transformation.

6. A method of acquiring and processing MR data from a sample, comprising the following steps:

placing the sample in a homogeneous magnetic field;

applying to the sample a first set of RF fields produced by a multiple-echo pulse sequence having a plurality of refocussing pulses and a first set of gradient fields in such a manner as to cause the sample to produce spin echo signals at predetermined phase-encoding gradients;

applying to the sample a second set of RF fields produced by a multiple-echo pulse sequence having a like plurality of refocussing pulses and a second set of gradient fields in such a manner as to cause the sample to produce spin echo signals at said predetermined phase-encoding gradients;

selecting pairs of spin echo signals in such a manner that spin echos in a single pair are produced by different sets of RF fields and have identical phase-encoding;

averaging the spin echo signals in each such pair to produce average echo signals; and using said average echo signals as data for a Fourier transformation.

7. A method of processing MR data which is acquired using a pulse sequence having an even number R of refocussing pulses and G readout gradient pulses after each refocussing pulse and producing R*G echo signals which are acquired using a plurality of predetermined phase-encoding gradients, in such a manner that R*G/2 pairs of echo signals are produced wherein spin echo signals in each pair are produced at the same phase-encoding, the method comprising the step of averaging the echo signals in each such pair.

8. A method of processing MR data which is acquired using two pulse sequences each having R refocussing pulses and G readout gradient pulses after each refocussing pulse and each producing R*G echo signals which are acquired using a plurality of predetermined phase-encoding gradients in such a manner that 2R*G pairs of echo signals are produced wherein spin echo signals in each pair are taken from different pulse sequences and are produced at the same phase-encoding, the method comprising the step of averaging the echo signals in each such pair.

9. The method of claim 8, wherein the phase-encoding gradients in the pulse sequences vary temporally inversely with respect to each other.

10. The method of claim 1 or claim 2, wherein said predetermined phase-encoding gradients vary between a positive extreme and a negative extreme, said positive extreme and said negative extreme having different absolute values.

* * * * *